(12) United States Patent
Deng et al.

(10) Patent No.: US 8,361,335 B2
(45) Date of Patent: Jan. 29, 2013

(54) METHODS FOR FABRICATING SEMICONDUCTOR DEVICES

(75) Inventors: Yunfei Deng, San Jose, CA (US); Jongwook Kye, Pleasanton, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 783 days.

(21) Appl. No.: 12/480,232

(22) Filed: Jun. 8, 2009

(65) Prior Publication Data

US 2010/0311242 A1    Dec. 9, 2010

(51) Int. Cl.
*B44C 1/22* (2006.01)
*H01L 21/302* (2006.01)

(52) U.S. Cl. ............ 216/41; 438/689; 438/725; 430/5; 430/312

(58) Field of Classification Search ............ 438/689, 438/725; 430/5, 312; 216/41
See application file for complete search history.

(56) References Cited

U.S. PATENT DOCUMENTS

| | | | |
|---|---|---|---|
| 6,737,202 | B2 | 5/2004 | Gehoski et al. |
| 2009/0117491 | A1* | 5/2009 | Hendel et al. .............. 430/296 |
| 2009/0253080 | A1* | 10/2009 | Dammel et al. ............ 430/324 |
| 2010/0183851 | A1* | 7/2010 | Cao et al. ................ 428/195.1 |

OTHER PUBLICATIONS

Haavind, Bob. Ed. Solid State Technology: The International Magazine for Semiconductor Manufacturing. "Litho will get much tougher with double patterning, extensive computation," May 2008. Downloaded Jun. 4, 2009. http://www.solid-state.com /display_article/ 329413/5/none/none/UPFRN/Litho-will-get-much-tougher-withdouble-patterning,-extensive-computatio.

Slezak, Mark. The Nikon eReview. "Double Patterning Single Etch Solutions from JSR," Newsletter, Fall 2008. Downloaded Jun. 4, 2009. http://www.nikonprecision.com/newsletter/fall_2008/article_02.html.

* cited by examiner

*Primary Examiner* — Shamim Ahmed
(74) *Attorney, Agent, or Firm* — Ingrassia Fisher & Lorenz, P.C.

(57) ABSTRACT

Methods are provided for fabricating a semiconductor device. One method comprises providing a first pattern having a first polygon, the first polygon having a first tonality and having a first side and a second side, the first side adjacent to a second polygon having a second tonality, and the second side adjacent to a third polygon having the second tonality, and forming a second pattern by reversing the tonality of the first pattern. The method further comprises forming a third pattern from the second pattern by converting the second polygon from the first tonality to the second tonality forming a fourth pattern from the second pattern by converting the third polygon from the first tonality to the second tonality forming a fifth pattern by reversing the tonality of the third pattern, and forming a sixth pattern by reversing the tonality of the fourth pattern.

19 Claims, 6 Drawing Sheets

METHODS FOR FABRICATING SEMICONDUCTOR DEVICES

FIELD OF THE INVENTION

The present invention generally relates to methods for fabricating semiconductor devices, and more particularly relates to methods for fabricating semiconductor devices using a double patterning lithography technique and to photomasks for such a technique

BACKGROUND OF THE INVENTION

There is a continuing trend within the microelectronics industry to incorporate more circuitry having greater complexity on a single integrated circuit (IC) chip. Maintaining this trend generally entails shrinking the size of individual devices within the circuit by reducing the critical dimensions (CDs) of device elements along with the pitch, or the CD of such an element added to the spacing between elements. Microlithography tooling and processing techniques play an important role in resolving the features necessary to fabricate devices and accordingly, are continually under development to meet industry milestones relating to the CD and pitch characteristic of each new technology generation.

High numerical aperture (NA) 193 nanometer (nm) optical projection stepper/scanner systems in combination with advanced photoresist processes now are capable of routinely resolving complex patterns that include isolated and dense resist features having CDs and pitches, respectively, well below the exposure wavelength. However, to meet the requirements of device design rules which continue to push the resolution limits of existing processes and tooling, other more specialized techniques have been developed to further enhance resolution. These include double patterning techniques (DPT) in which device patterns having potentially optically unresolvable features are decomposed into two or more complementary, and more easily resolvable patterns, each containing features with larger CDs and/or a relaxed pitch. One such DPT is referred to as litho/etch/litho/etch (LELE), and involves two separate lithographic exposures each followed by an etch process. These exposures are performed using different photomask reticles, each designed to image a portion of the total pattern. However, this scheme includes an additional etch step between lithography steps which increases fabrication cost and adds complexity to process logistics as wafers are transported between lithography and etch areas of a typical fab line. Other DPT processing options include spacer lithography processing often used, for example, in the fabrication of FinFet devices. However, these processes typically introduce several additional steps into a fabrication sequence adding yet further cost and complexity to the overall device fabrication process.

DPT processes which utilize a single etch step known as litho/freeze/litho/etch (LFLE) have also been developed. In LFLE, a first pattern is imaged into a first layer of photoresist, and the resist layer then is "frozen" rendering it unaffected by a second, subsequent photoresist process. A second pattern, complementary to the first pattern, then is formed into the second resist layer. However, the resolution conventionally attainable, for example, for isolated and dense trenches using existing LFLE processes is still limited to that of the lithography process.

Accordingly, it is desirable to provide methods for fabricating semiconductor devices using DPT processes which provide improved resolution over existing DPT processes. Further, it is also desirable to provide methods for designing photomask patterns for such DPT processes. Furthermore, it is also desirable to provide photomasks for such DPT processes. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods are provided for fabricating a semiconductor device. In accordance with an exemplary embodiment of the invention, one method comprises the steps of providing a first pattern design having a first polygon, the first polygon having a first tonality and having a first side and a second side, the first side adjacent to a second polygon having a second tonality, and the second side adjacent to a third polygon having the second tonality. The method also comprises forming a second pattern design by reversing the tonality of the first pattern design, and wherein the first polygon is converted from the first tonality to the second tonality, and wherein the second and third polygons are both converted to the first tonality. The method further comprises forming a third pattern design from the second pattern design by converting the second polygon from the first tonality to the second tonality forming a fourth pattern design from the second pattern design by converting the third polygon from the first tonality to the second tonality forming a fifth pattern design by reversing the tonality of the third pattern design, and forming a sixth pattern design by reversing the tonality of the fourth pattern design.

A method is provided for fabricating a semiconductor device in accordance with another exemplary embodiment of the invention. The method comprises providing a semiconductor substrate forming a first photoresist layer overlying the semiconductor substrate, and forming a first opening in the first photoresist layer, the first opening having a first side surface and a second side surface substantially parallel each other. The method also comprises freezing the first photoresist layer, forming a second photoresist layer on the first photoresist layer and in the first opening, and forming a second opening in the second photoresist layer, the second opening having a third side surface substantially parallel to the first and second side surfaces and positioned overlying the substrate between the first and second side surfaces, and a fourth side surface substantially parallel to the third side surface and positioned overlying the first photoresist layer.

A photomask set suitable for a double patterning lithography technique is provided. The set comprises a first photomask comprising a first surface, a first substantially opaque layer on the first surface, and a first substantially transparent polygon etched into the first substantially opaque layer, the first substantially transparent polygon having a first side and a second side substantially parallel each other. The set also comprises a second photomask comprising a second surface, a second substantially opaque layer on the second surface, and a second substantially transparent polygon etched into the second substantially opaque layer, the second substantially transparent polygon having a third side and a fourth side substantially parallel to the first and second sides, and wherein the first and second substantially transparent polygons overlap when the first and second photomasks are aligned to each other.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Manufacturing of modern semiconductor devices requires high resolution DPT lithography processing methods. In accordance with one embodiment, one such method includes fabricating semiconductor devices using a DPT process which provides improved resolution over existing DPT processes, and designing pattern layouts for such a DPT process. This method involves decomposing a master pattern layout for a semiconductor device layer into two separate and complementary sub patterns for use in a DPT process. The layout of the master pattern contains isolated and/or dense features having CDs and pitches, respectively, that are difficult or impossible to resolve with an existing lithography process and tool set, while each of the sub patterns contains only resolvable isolated and/or dense features. The two sub patterns are sequentially imaged into separate layers of photoresist such that the resulting photoresist mask is open in intersecting or common regions between the two sub patterns. Accordingly, the previously unresolvable isolated and/or dense photoresist mask features are formed by the separate patterning of a combination of two sub patterns having larger, more resolvable features. Further, photomasks suitable for use with these methods are also provided.

FIGS. 1-7 illustrate schematically, methods for fabricating semiconductor devices using a master pattern layout for a semiconductor device layer which has been decomposed into a pair of sub patterns, in accordance with exemplary embodiments of the invention. The sub patterns will be used in conjunction with a DPT, described more fully below, to fabricate a photoresist mask on a semiconductor substrate that will be used in the fabrication of a semiconductor device. The photoresist mask has isolated and dense features having improved resolution and smaller pitch than otherwise attainable by directly patterning the master layout using a single lithography step. While the decomposition of a master pattern layout having a particular geometry and configuration of features is illustrated, it will be appreciated that the methods depicted in FIGS. 1-7 can be used to decompose other master pattern layouts having features of other geometries in any number of different configurations.

Figure 1:
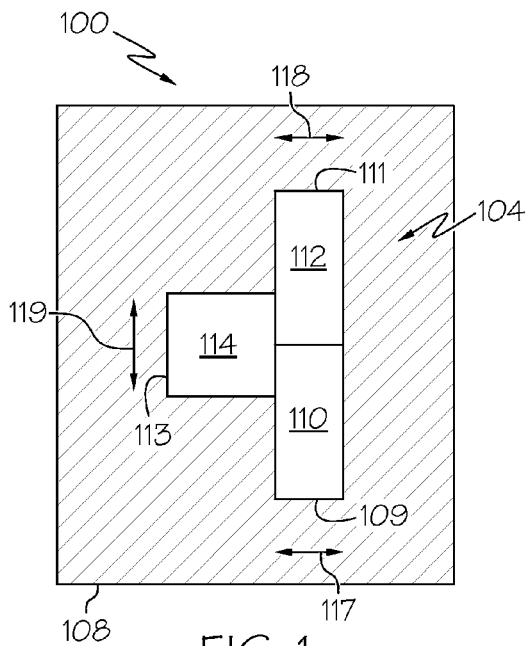
FIGS. 1-7 schematically illustrate methods for fabricating semiconductor devices using a double patterning technique, in accordance with an exemplary embodiment of the present invention.

Referring to FIG. 1, in accordance with an exemplary embodiment, these methods begin by providing an original master pattern layout 100. Master pattern layout 100 represents a two-dimensional design layout containing features pertaining to a particular layer of a semiconductor device, and is not limited with respect to dimension or to the number or shape of features contained therein. While pattern layout 100 may contain any number of features as required for implementing the device, for the sake of simplicity and clarity, this invention will be described in the context of a T-shaped feature 104 surrounded by a field 108. In this example, feature 104 is composed of three individual rectangular polygons 110, 112, and 114. However, those of skill in the art will appreciate that feature 104 may include any number of overlapping or non-overlapping polygon shapes including rectangles, trapezoids, and the like, that when composed, form the desired feature. Further, no distinction is made regarding the manner by which a designed feature is formed, such as whether the feature is drawn directly, or whether the feature is formed indirectly as a central region bounded by a plurality of other drawn features.

The design contained within pattern layout 100 will be ultimately transferred onto a photomask as either substantially opaque or substantially transparent features. Accordingly, the polygons used to compose features and field regions may be designated in accordance with the resultant photomask tonality. For example, design features that result in a substantially transparent mask region may be designated as "clear" or "brightfield" tone features, and are illustrated without cross-hatching in FIGS. 1-7. Conversely, design features that result in a substantially opaque mask region may be designated as "dark" or "darkfield" tone features, and are illustrated with cross-hatching in FIGS. 1-7. Accordingly, polygons 110, 112, and 114 are designated as clear or brightfield features while surrounding regions of field 108 are designated as dark or darkfield. The invention addresses the situation in which any or all of polygons 110, 112, and 114 has a CD that is below the resolution limit of an existing photoresist process and exposure toolset with acceptable processing latitude. For example, any or all of sides 109, 111, and 113 of polygons 110, 112, and 114, respectively, has a dimension (as represented by double-headed arrows 117, 118, and 119, respectively) below the threshold CD resolution limit. Accordingly, as will be described more fully below, master pattern layout 100 will be decomposed and divided into two separate sub patterns to be used in conjunction with a double patterning technique as a means of resolving such features.

Figure 2:
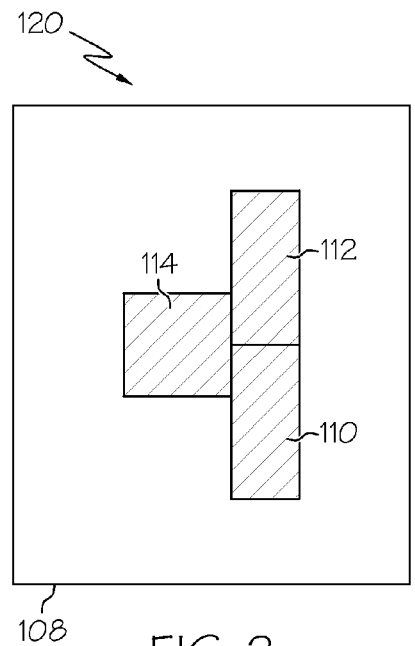

Next, the tonality of master pattern layout 100 is globally reversed to form inverse master pattern 120, as illustrated in FIG. 2. That is, regions formerly brightfield in master pattern layout 100 are transformed into darkfield, and those originally darkfield are converted to brightfield. For example, polygons 110, 112, and 114 now appear as darkfield features on a brightfield background of field 108.

Figure 3:
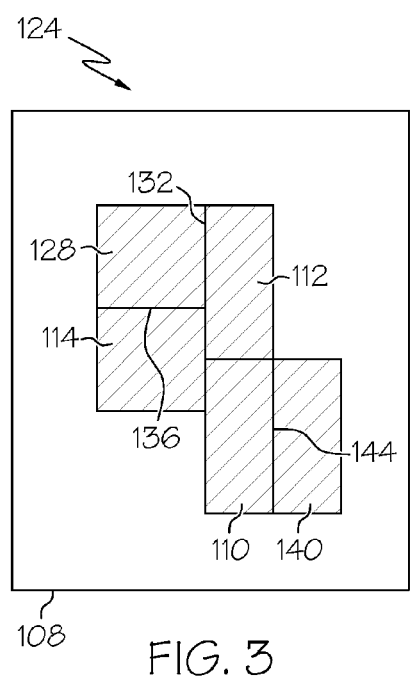
Figure 4:
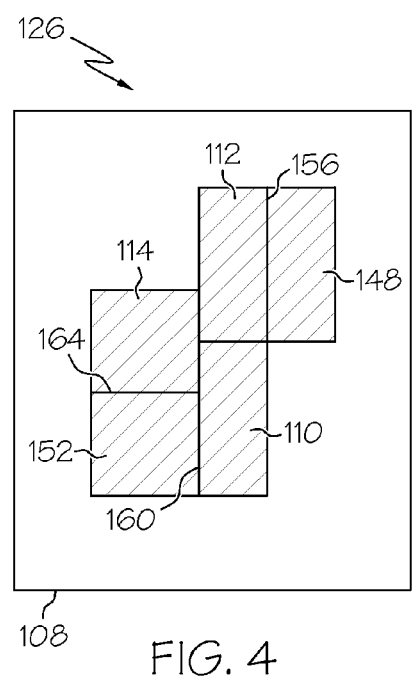

Inverse master pattern 120 then is converted into two separate complementary inverse sub patterns 124 and 126, as illustrated in FIGS. 3-4, respectively. Referring to FIG. 3, inverse sub pattern 124 contains each of the elements of inverse master pattern 120, and also includes polygons 128 and 140 added as darkfield polygons to supplement the CD of polygons 110, 112, and 114. That is, a polygon 128 is added adjacent to a side 132 of polygon 112, and adjacent to a side 136 of polygon 114, and a polygon 140 is added adjacent to a side 144 of polygon 110. As used herein, polygons described as adjacent each other, share a common side. Further, polygons sharing a common side are substantially parallel to each other along this side. Referring to FIG. 4, inverse sub pattern 126 also includes each of the elements of inverse master pattern 120, and also includes additional darkfield polygons 148 and 152 to supplement the CD of polygons 110, 112, and 114. That is, polygon 148 is added adjacent a side 156 of polygon 112, and is thus substantially parallel to polygon 112 along side 156. Polygon 152 is added adjacent sides 160 and 164 of polygons 110 and 114, respectively, and is thereby substantially parallel to these sides.

Figure 5:
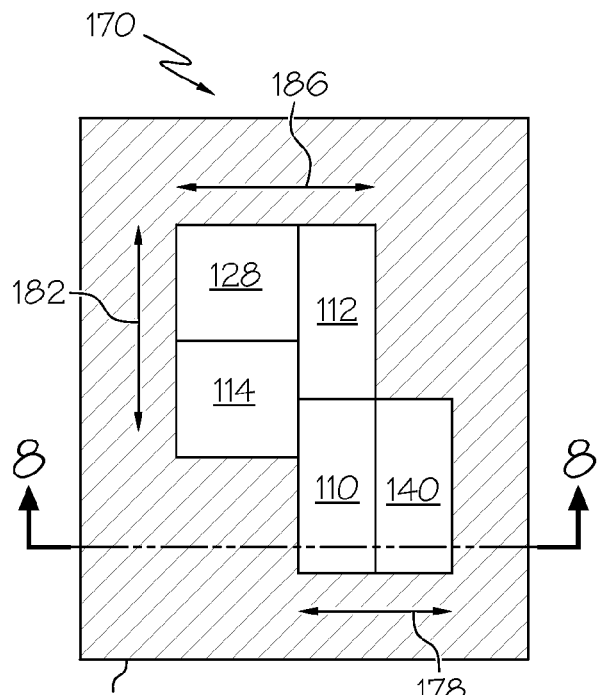
Figure 6:
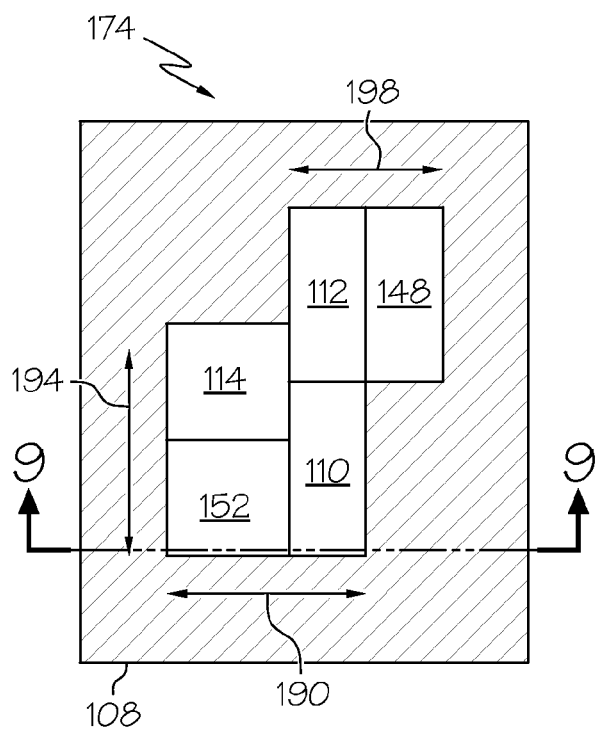
Figure 7:
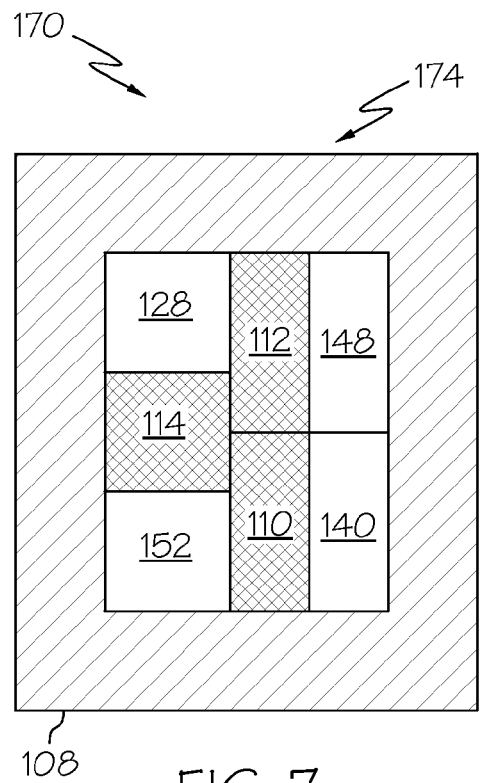

Next, the tonality of inverse sub patterns 124 (FIG. 3) and 126 (FIG. 4) are reversed to form normal sub patterns 170 and 174, respectively, as illustrated in FIGS. 5-6. Referring to FIG. 5, normal sub pattern 170 includes polygons 110, 112, 114, 128, and 140 converted to brightfield features, while field 108 is converted to a darkfield region. When represented on a photomask, the combination of brightfield polygons 110 and 140 will form a clear substantially rectangular feature having a CD (as represented by double-headed arrow 178) which is resolvable with an acceptable amount of processing latitude. Similarly, polygon 114 in combination with polygon 128, and polygon 112 in combination with polygon 128 have CDs (as represented by double-headed arrows 182 and 186, respectively) each acceptably resolvable.

Referring to FIG. 6, normal sub pattern 174 includes polygons 110, 112, 114, 148, and 152 converted to brightfield features, while field 108 is converted to a darkfield region. When these polygons are fabricated onto a photomask, the combination of brightfield polygons 110 and 152 will form a clear feature having a CD (as represented by double-headed arrow 190) which is resolvable with acceptable processing latitude. Similarly, polygon 114 in combination with polygon 152, and polygon 112 in combination with polygon 148 (as represented by double-headed arrows 194 and 198, respectively) form clear features having CDs that are also acceptably resolvable. When aligned to and overlaid on each other, the intersection between normal sub patterns 170 and 174 comprises polygons 110, 112, and 114, as polygons common to both sub patterns. The remaining polygons 128, 140, 144, and 152 are contained within only one of the sub patterns. Accordingly, the intersecting polygon set, illustrated in FIG. 7 as double cross-hatched regions, comprises the same polygons having the same tonality as contained within master pattern layout 100.

Figure 8:
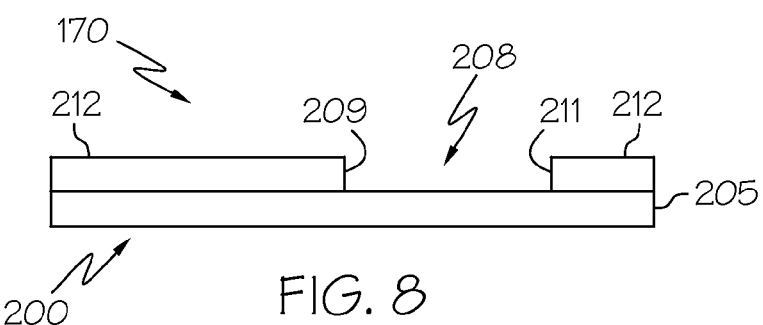
FIGS. 8-9 schematically illustrate methods for fabricating semiconductor devices using a double patterning technique, in accordance with another exemplary embodiment of the present invention.
Figure 9:
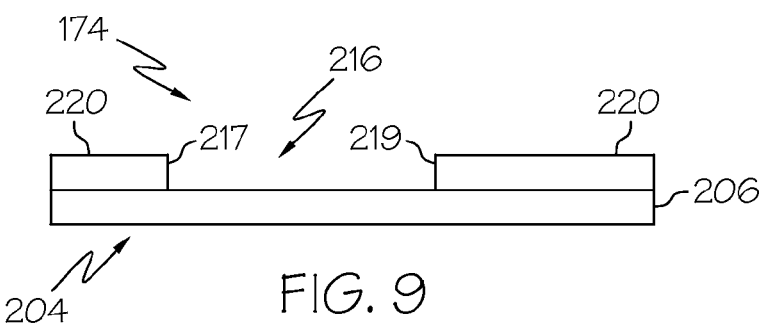

FIGS. 8-9 schematically illustrate, in cross-section, photomasks 200 and 204 fabricated using normal sub patterns 170 and 174, respectively, in accordance with an exemplary embodiment. Photomasks 200 and 204 form an exemplary set of photomasks configured for use with a DPT lithography process, and comprise photomask blanks 205 and 206, respectively, each made from a material substantially transparent to radiation of the exposing source wavelength such as, for example, quartz. Photomasks 200 and 204 contain normal sub patterns 170 and 174, respectively, reproduced in any magnification such as, for example, 1×, 4×, 5×, and the like, suited for the optical lithography system to be used. Photomask 200 has opaque and clear features representative of normal sub pattern 170, and includes polygons 110 and 140 merged together as a single clear feature 208 having sides 209 and 211, and having opaque regions 212 representative of field 108 (FIG. 5) on either side thereof. In one embodiment, sides 209 and 211 are substantially parallel. Similarly, photomask 204 includes polygons 110 and 152 (FIG. 6) merged together as a clear feature 216 between opaque regions 220, and having sides 217 and 219. In another embodiment, sides 217 and 219 are substantially parallel. In a further embodiment, when photomasks 200 and 204 are in alignment with each other, sides 209 and 211 on photomask 200 are substantially parallel sides 217 and 219 on photomask 204. Opaque regions 212 and 220 comprise a layer of a material such as, for example, chromium or chromium oxide, that is substantially opaque to radiation of the wavelength to be used for exposure.

Figure 10:
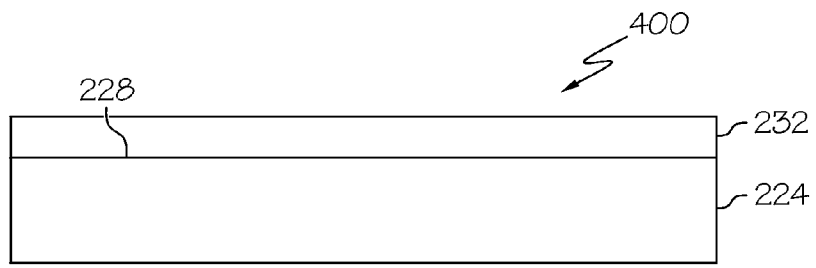
FIGS. 10-14 schematically illustrate, in cross-section, methods for fabricating semiconductor devices using a double patterning technique, in accordance with a further exemplary embodiment.

FIGS. 10-14 schematically illustrate, in cross-section, methods for fabricating a semiconductor device 400 including the steps of patterning a substrate 224 in and upon which the semiconductor device is fabricated, using photomasks 200 and 204, in accordance with another exemplary embodiment. Referring to FIG. 10, substrate 224 may be any of the types commonly used in the fabrication of semiconductor devices such as silicon, germanium, a III-V material such as gallium arsenide, or another semiconductor material. Substrate 224 may be a bulk wafer or may be of a layered configuration such as, for example, a semiconductor-on-insulator (SOI) configuration comprising a thin layer of monocrystalline semiconductor material on an insulating layer supported by a semiconductor carrier wafer. Substrate 224 may optionally include without limitation one or more layers of additional materials having a surface 228. These layers may also include any of the materials commonly used in semiconductor device fabrication such as, for example, semiconductor materials, dielectrics, conductive metal layers, and the like, and may include an organic or inorganic anti-reflective coating (ARC) or layer as a means of enhancing subsequent photoresist processing. While for ease of description the method described herein is illustrated by its application to the formation of semiconductor devices having isolated trenches, those of skill in the art will appreciate that the method is applicable to the fabrication of a myriad of semiconductor devices.

A photoresist layer 232 is applied overlying surface 228. Photoresist layer 232 is an organic photoresist or "resist" layer sensitized to exposure from radiation of a particular wavelength or range of wavelengths. Such exposure wavelengths include, but are not limited to, 365 nanometer (nm), 248 nm, 193 nm, 157 nm, 126 nm, or 13.4 nm. Photoresist layer 232 may be either a positive acting or "positive tone" resist designed to be removed by a developer in regions exposed to actinic radiation, or a negative acting or "negative tone" resist designed to be removed by a developer in unexposed regions. Because this invention is directed to the formation of features on a semiconductor device of either positive or negative tone, the photoresist tonality is selected so as to complement the mask design and result in the formation of features having the desired tone in the resist film. Accordingly, to fabricate a trench using the exemplary clear features 208 and 216 of photomasks 200 and 204, respectively, a positive tone resist is selected and herein described. However, those of skill in the art will appreciate that these methods may be applied with equal result in the formation of a trench in a photoresist layer using a negative tone resist in conjunction with photomasks having a reversed tonality. Layout patterns for such photomasks can be prepared using methods previously described and illustrated in FIGS. 1-7 by globally reversing the tone of the pattern at each step. Photoresist layer 232 is applied using a suitable technique, such as, most commonly, by using a spin-coating and post application bake (PAB) process sequence.

Figure 11:
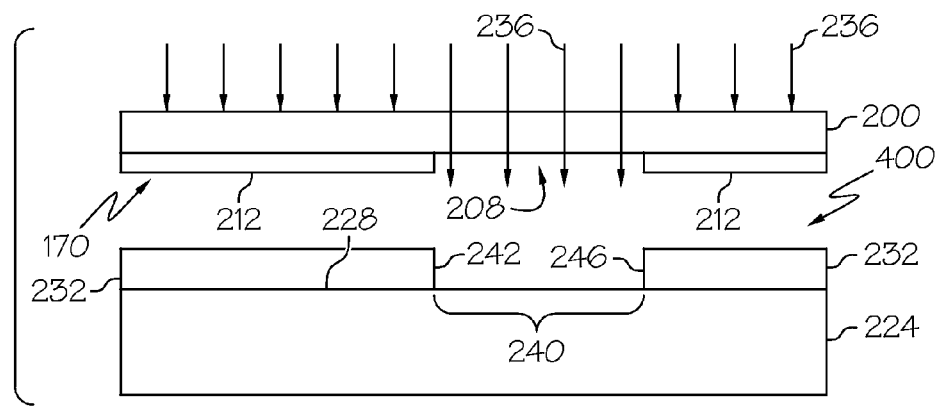

Next, photomask 200 is used to selectively expose layer 232, as illustrated in FIG. 11. Photomask 200 is used in conjunction with an optical exposure system, such as, for example, a step-and-scan lithography system having a lens assembly configured to project and focus normal sub pattern 170 onto layer 232. Exposing radiation (as represented by arrows 236) passes through clear feature 208, and is substantially blocked from reaching photoresist layer 232 by opaque regions 212. Following exposure, layer 232 is developed to form an opening 240 having side surfaces 242 and 246. In one embodiment, side surfaces 242 and 246 are substantially parallel to each other. Resist development typically includes immersion of photoresist layer 232 in a suitable developing solution and, depending upon the type of resist used, also commonly includes a post exposure bake (PEB) step performed prior to developer immersion.

Figure 12:
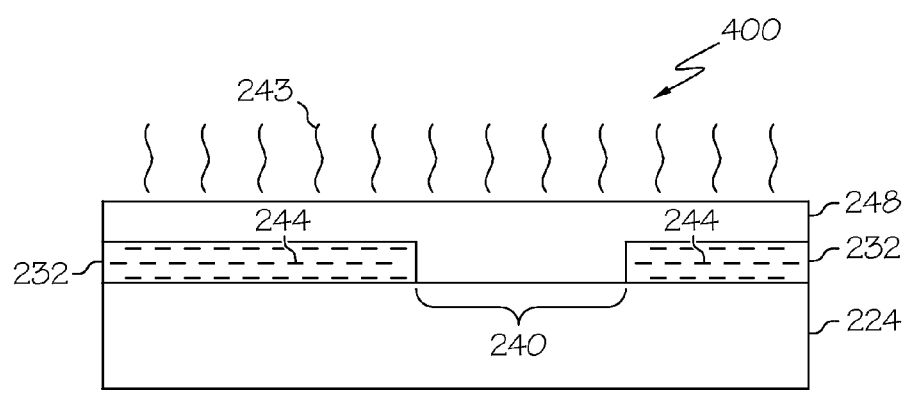

Photoresist layer 232 is stabilized or "frozen" (as represented by dash lines 244) using a suitable freezing process, as illustrated in FIG. 12. The term "freezing" as used herein in the context of a photoresist, means that the resist layer has been chemically and structurally stabilized for use in conjunction with a subsequent photoresist patterning process. Accordingly, a frozen resist layer substantially maintains pattern fidelity for use as an etch mask when subjected to the coating, baking, exposure, and development steps associated with the second resist layer. The freezing of layer 232 may be performed using a suitable process including but not limited to exposure to heat and/or ultraviolet (UV) radiation (as represented by lines 243), ion bombardment, electron bombardment, and the like, in a manner that cross-links polymers within the resist. Alternatively, freezing may be done through a chemical treatment which stabilizes the resist to the above processes. Next, a photoresist layer 248 is applied as a blanket coating overlying photoresist layer 232 and within opening 240. Layer 248 may be applied as previously described with reference to layer 232, and illustrated with respect to FIG. 11.

Figure 13:
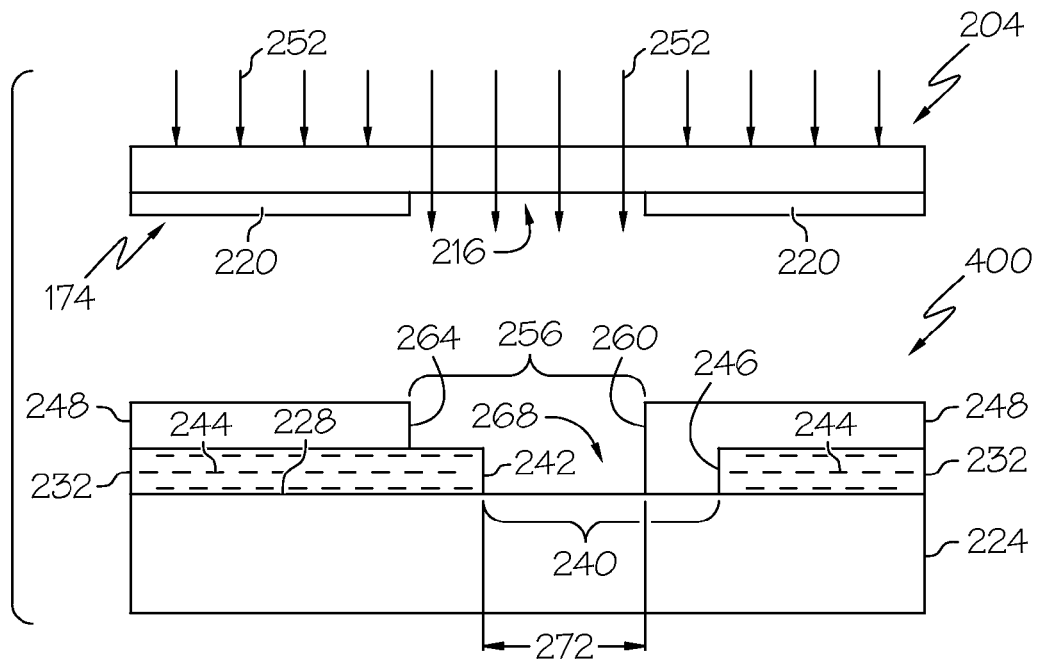
Figure 14:
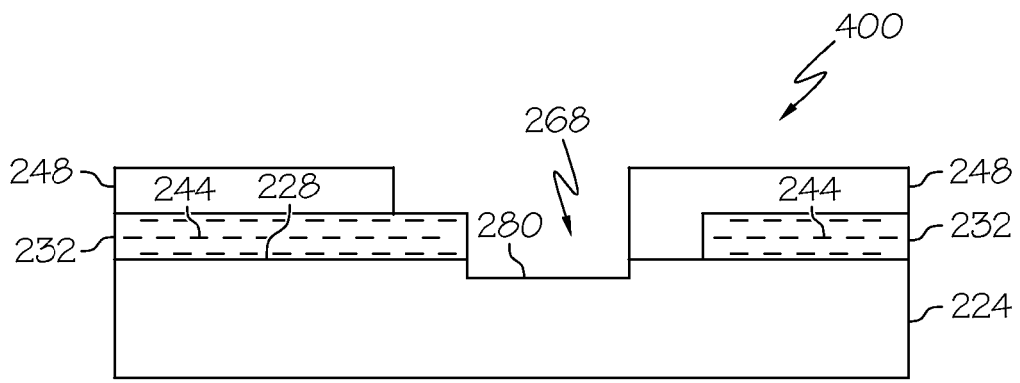

Photoresist layer 248 is selectively exposed to radiation (as represented by arrows 252) through photomask 204, as illustrated in FIG. 13. Exposing radiation passes through a clear feature 216 to expose layer 248, but is blocked from reaching layer 248 by opaque features 220. Layer 248 optionally is subjected to a post-exposure bake, and is developed following exposure as previously described with reference to layer 232, and illustrated with respect to FIG. 11. The exposure and developing processes result in an opening 256 in photoresist layer 248 having a side surface 260 positioned overlying substrate surface 228 and a side surface 264 positioned overlying photoresist layer 232. In one embodiment, side surfaces 260 and 264 are substantially parallel each other and to side surfaces 242 and 246. Because photoresist layer 232 was frozen as described above, side surface 242 remains substantially unaltered during the patterning of photoresist layer 248 and, in conjunction with side surface 260, form an opening 268 which provides access to surface 228. Accordingly, because opening 268 constitutes the intersection of openings 240 and 256, it has a CD (as represented by double headed arrows 272) less than that of either opening, and substantially identical to the original desired opening as represented by polygon 110 illustrated in FIG. 1. A trench 280 then may be etched into surface 228 through opening 268 using the composite of patterned layers 232 and 248 as an etch mask via a suitable wet or dry etch process, as illustrated in FIG. 14.

Figure 15:
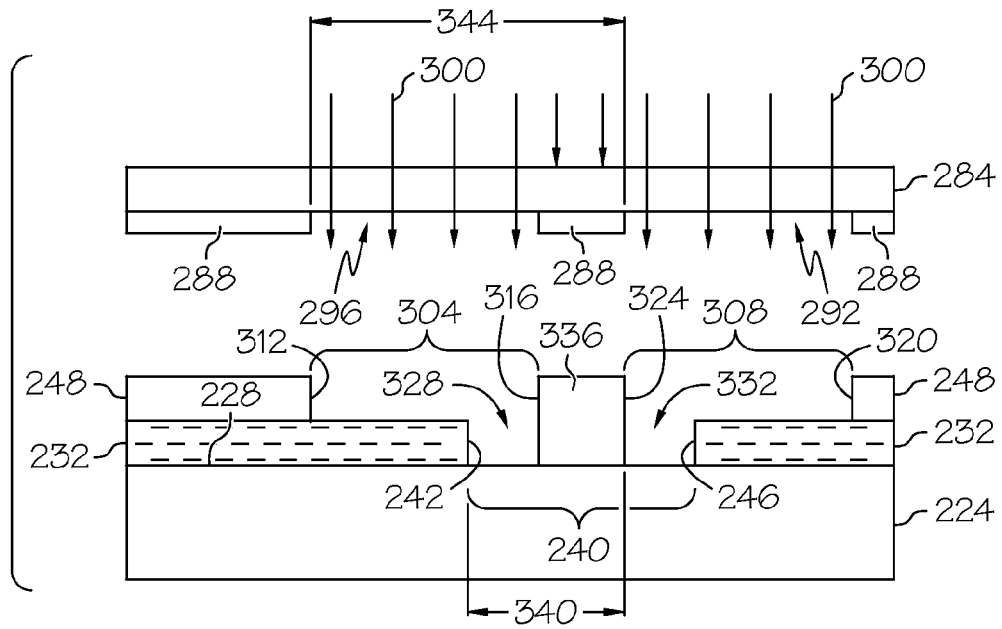
FIGS. 15-16 schematically illustrate, in cross-section, methods for fabricating semiconductor devices using a double patterning technique, in accordance with yet another exemplary embodiment.
Figure 16:
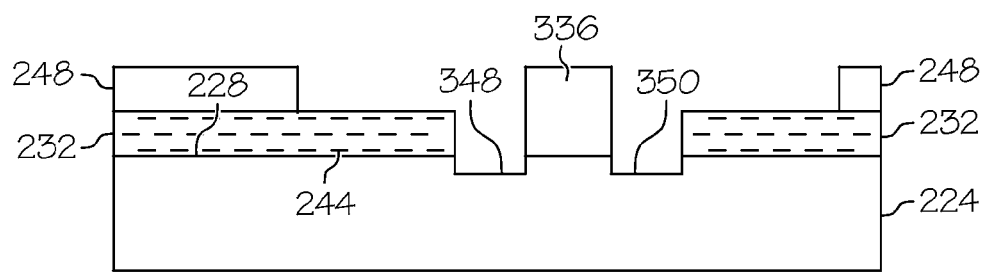

FIGS. 15-16 schematically illustrate, in cross-section, methods for forming a photoresist mask overlying surface 228 comprising a dense trench pattern, in accordance with another exemplary embodiment. This method begins with steps that are illustrated in FIGS. 10-12, and previously described. Following a blanket application, photoresist layer 248 is patterned using a photomask 284, as illustrated in FIG. 15. Photomask 284 contains a dense line/space pattern which includes substantially opaque features 288 adjacent substantially transparent features 292 and 296. Layer 248 is exposed (as represented by arrows 300) through photomask 284, and is subsequently developed as previously described to form openings 304 and 308. Opening 304 has a side surface 312 positioned overlying layer 232 and a side surface 316 positioned overlying substrate surface 228. In one embodiment, side surfaces 312 and 316 are substantially parallel. In another embodiment, side surfaces 312 and 316 are substantially parallel to each other and to side surfaces 242 and 246. Opening 308 has a side surface 320 positioned overlying layer 232 and a side surface 324 positioned overlying substrate surface 228. As described above, side surface 242 is frozen and as such is substantially unaffected by the processing of photoresist layer 248 and, in conjunction with side surface 316, forms a photoresist mask opening 328 that exposes surface 228. Similarly, a photoresist mask opening 332 that exposes surface 228 is bounded by side surface 246 of photoresist layer 232 in conjunction with side surface 324 of photoresist layer 248. Photoresist mask openings 328 and 332 are separated by resist line 336 formed overlying surface 228 comprising photoresist layer 248. Accordingly, because each of photoresist mask openings 328 and 332 is formed by the intersection of two larger resist openings, the resulting pitch (as represented by double headed arrows 340) of photoresist mask openings 328 and 332 is less than the pitch (measured at 1×, and as represented by double headed arrows 344) of features used to form them in photomask 284. Next, substrate 224 may be suitably etched through photoresist mask openings 328 and 332 to form trenches 348 and 350, respectively, as illustrated in FIG. 16.

Accordingly, methods have been provided for fabricating a semiconductor device including the steps of forming a photoresist mask pattern having enhanced resolution and pitch of isolated and dense features, respectively. These methods include a process for decomposing a single master pattern layout that contains potentially unresolvable isolated or dense features into a pair of sub patterns containing only larger, more resolvable features. The sub patterns are imaged onto two separate photomasks and used with an LFLE-type DPT process to form the final photoresist mask. In addition to isolated features, these methods may be used to enhance the resolution of features having other shapes composed of isolated segments such as L-shaped, T-shaped, or U-shaped designs, and the like. Methodologies related to both pattern generation and photoresist processing are compatible with either a positive or negative tone photoresist process by adjusting the tone of pattern layouts and photomasks appropriately. Accordingly, these methods may be used to further extend the resolution limits of the lithography tool set and photoresist processes with which they are used.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method of fabricating a semiconductor device comprising the steps of:
   providing a first pattern design having a first polygon, the first polygon having a first tonality and having a first side and a second side, the first side adjacent to a second polygon having a second tonality, and the second side adjacent to a third polygon having the second tonality;
   forming a second pattern design by reversing the tonality of the first pattern design, and wherein the first polygon is converted from the first tonality to the second tonality, and wherein the second and third polygons are both converted to the first tonality;

forming a third pattern design from the second pattern design by converting the second polygon from the first tonality to the second tonality;

forming a fourth pattern design from the second pattern design by converting the third polygon from the first tonality to the second tonality;

forming a fifth pattern design by reversing the tonality of the third pattern design; and forming a sixth pattern design by reversing the tonality of the fourth pattern design.

2. The method of claim 1, wherein the step of providing a first pattern design having a first polygon, the first polygon having a first tonality comprises providing a first pattern design having a first polygon, the first polygon having a brightfield tonality.

3. The method of claim 1, wherein the step of providing a first pattern design having a first polygon, the first polygon having a first tonality comprises providing a first pattern design having a first polygon, the first polygon having a darkfield tonality.

4. The method of claim 1, wherein the step of providing a first pattern design having a first polygon comprises providing a first pattern design having a first rectangular polygon.

5. The method of claim 1, further comprising the step of fabricating a first photomask containing the fifth pattern.

6. The method of claim 5, further comprising the step of fabricating a second photomask containing the sixth pattern.

7. The method of claim 1, wherein the step of providing a first pattern design having a first polygon and a second polygon comprises providing a first pattern design having a first polygon and second polygon substantially parallel to the first polygon.

8. The method of claim 1, wherein the step of providing a first pattern design having a first polygon and a third polygon comprises providing a first pattern design having a first polygon and a third polygon substantially parallel to the first polygon.

9. The method of claim 6, further comprising the steps of:
forming a first photoresist layer overlying the semiconductor substrate;
patterning the fifth design pattern into the first photoresist layer using the first photomask;
freezing the first photoresist layer;
forming a second photoresist layer overlying the first photoresist layer; and
patterning the sixth design pattern into the second photoresist layer using the second photomask.

10. The method of claim 9, further comprising the step of etching the semiconductor substrate.

11. A method of fabricating a semiconductor device comprising the steps of:

providing a semiconductor substrate;
forming a first photoresist layer overlying the semiconductor substrate;
forming a first opening in the first photoresist layer, the first opening having a first side surface and a second side surface substantially parallel each other;
freezing the first photoresist layer;
forming a second photoresist layer overlying the first photoresist layer and extending into the first opening; and
forming a second opening in the second photoresist layer, the second opening having a third side surface substantially parallel to the first and second side surfaces and positioned overlying the substrate between the first and second side surfaces, and a fourth side surface substantially parallel to the third side surface and positioned overlying the first photoresist layer.

12. The method of claim 11, further comprising etching the substrate between the second and third side surfaces.

13. The method of claim 11, further comprising forming a third opening in the second photoresist layer, the third opening having a fifth side surface substantially parallel to the first and second side surfaces and positioned overlying the substrate between the first and second side surfaces, and a sixth side surface substantially parallel to the fifth side surface and positioned overlying the first photoresist layer.

14. The method of claim 13, further comprising etching the substrate between the first and fifth side surfaces.

15. The method of claim 11, wherein the step of forming a first photoresist layer comprises forming a first positive-acting photoresist layer.

16. The method of claim 15, wherein the step of forming a second photoresist layer comprises forming a second positive-acting photoresist layer.

17. The method of claim 11, wherein the step of forming a first photoresist layer comprises forming a first negative-acting photoresist layer.

18. The method of claim 11, further comprising forming a third opening in the first photoresist layer, the third opening adjacent the first opening and having a fifth side surface and a sixth side surface substantially parallel each other and substantially orthogonal to the first and second side surfaces.

19. The method of claim 18, further comprising forming a fourth opening in the second photoresist layer, the fourth opening adjacent the second opening and having a seventh side surface substantially parallel to the fifth and sixth side surfaces and positioned overlying the substrate between the fifth and sixth side surfaces, and an eighth side surface substantially parallel to the seventh side surface and positioned overlying the first photoresist layer.

* * * * *